United States Patent
Li et al.

(10) Patent No.: US 12,520,692 B2
(45) Date of Patent: Jan. 6, 2026

(54) DISPLAY PANEL

(71) Applicant: Yungu (Gu'an) Technology Co., Ltd., Hebei (CN)

(72) Inventors: Hongrui Li, Langfang (CN); Rusheng Liu, Langfang (CN); Hongqing Feng, Langfang (CN); Bing Zhang, Langfang (CN); Cuili Gai, Langfang (CN)

(73) Assignee: Yungu (Gu'an) Technology Co., Ltd., Langfang (CN)

(*) Notice: Subject to any disclaimer, the term of this patent is extended or adjusted under 35 U.S.C. 154(b) by 216 days.

(21) Appl. No.: 18/324,407

(22) Filed: May 26, 2023

(65) Prior Publication Data

US 2023/0309218 A1    Sep. 28, 2023

Related U.S. Application Data

(63) Continuation of application No. PCT/CN2021/122921, filed on Oct. 9, 2021.

(30) Foreign Application Priority Data

Jan. 29, 2021  (CN) .......................... 202110130684.7

(51) Int. Cl.
*H05K 1/02* (2006.01)
*H10K 59/35* (2023.01)
*H10K 59/82* (2023.01)

(52) U.S. Cl.
CPC ......... *H10K 59/352* (2023.02); *H05K 1/0296* (2013.01); *H10K 59/82* (2023.02); *H05K 2201/09227* (2013.01)

(58) Field of Classification Search
CPC ...... H05K 1/02; H05K 59/352; H05K 1/0296; H05K 2201/09227; H10K 59/82
USPC .......................................................... 361/748
See application file for complete search history.

(56) References Cited

U.S. PATENT DOCUMENTS

2009/0066608 A1    3/2009  Nakamura

FOREIGN PATENT DOCUMENTS

| CN | 205845956 U | 12/2016 |
|---|---|---|
| CN | 107945738 A | 4/2018 |
| CN | 109801950 A | 5/2019 |
| CN | 110164912 A | 8/2019 |

(Continued)

OTHER PUBLICATIONS

KR 2011-0076641A (Year: 2011).*

(Continued)

*Primary Examiner* — Tremesha W Burns
(74) *Attorney, Agent, or Firm* — Maier & Maier, PLLC

(57) ABSTRACT

A display panel includes: a substrate; a plurality of pixel units arranged in an array along a first direction and a second direction intersecting each other, each of the pixel units includes N sub-pixels; and a plurality of pixel circuit units, each of the pixel circuit units includes N pixel circuits, each of the pixel circuit units is provided with at least one arrangement unit, and in the arrangement unit, M pixel circuits are arranged adjacently in sequence, in which an orthographic projection of the at least one arrangement unit of each of the pixel circuit units on the substrate overlaps an orthographic projection of P sub-pixels of a corresponding one of the pixel units on the substrate, and P is an integer greater than or equal to 1 and less than N.

18 Claims, 9 Drawing Sheets

(56) References Cited

FOREIGN PATENT DOCUMENTS

| | | |
|---|---|---|
| CN | 110164927 A | 8/2019 |
| CN | 110189706 A | 8/2019 |
| CN | 110518037 A | 11/2019 |
| CN | 110767712 A | 2/2020 |
| CN | 110928453 A | 3/2020 |
| CN | 111293158 A | 6/2020 |
| CN | 210955904 U | 7/2020 |
| CN | 111490068 A | 8/2020 |
| CN | 111490069 A | 8/2020 |
| CN | 111668278 A | 9/2020 |
| CN | 111834429 A | 10/2020 |
| CN | 111969027 A | 11/2020 |
| CN | 112259589 A | 1/2021 |
| CN | 112271203 | 1/2021 |
| KR | 1020110076641 A | 7/2011 |

OTHER PUBLICATIONS

International Search Report issued on Dec. 10, 2021, in corresponding International application No. PCT/CN2021/122921; 5 pages.
Chinese Notice of Grant issued Nov. 28, 2022, in related CN Application No. 202110130684.7; 8 pages.
Office Action issued on Apr. 25, 2025, in corresponding Korean Application No. 10-2023-7017863, 9 pages.

* cited by examiner

DISPLAY PANEL

CROSS REFERENCE TO RELATED APPLICATION

The present application is a continuation of International Application No. PCT/CN2021/122921 filed on Oct. 9, 2021, which claims the priority to Chinese Patent Application No. 202110130684.7 filed on Jan. 29, 2021, both of which are incorporated herein by reference in their entireties.

TECHNICAL FIELD

The present application relates to the field of display technology, and particularly, to a display panel.

BACKGROUND

With the rapid development of electronic devices, demands of users for the screen-to-body ratio are higher and higher, resulting in that the full-screen display of electronic devices attracts more and more attention in the industry.

Traditional electronic devices such as a cell phone and a tablet computer needs to integrate a front camera, a telephone receiver, an infrared sensing component and the like. In the prior art, a notch or a hole is formed in the display screen so that external light can enter the photosensitive component under the screen through the notch or the hole. Nonetheless, these electronic devices do not achieve a real full-screen display, and cannot display an image in all areas of the entire screen. For example, the area corresponding to the front camera cannot display the image.

SUMMARY

The present application provides a display panel, at least part of the display panel can be light-transmitting and can be used to display, facilitating the integration of the photosensitive component under the screen.

Embodiments of the present application provide a display panel, including: a substrate; a plurality of pixel units arranged on the substrate in an array along a first direction and a second direction intersecting each other, each of the pixel units including N sub-pixels, N being an integer greater than or equal to 3; and a plurality of pixel circuit units arranged on the substrate, each of the pixel circuit units including N pixel circuits, each of the pixel circuits being electrically connected to a corresponding one of the sub-pixels, each of the pixel circuit units being provided with at least one arrangement unit, and in the arrangement unit, M pixel circuits being arranged adjacently in sequence, M being an integer greater than or equal to 2 and less than or equal to N, wherein an orthographic projection of the at least one arrangement unit of each of the pixel circuit units on the substrate overlaps an orthographic projection of P sub-pixels of a corresponding one of the pixel units on the substrate, and P is an integer greater than or equal to 1 and less than N.

According to the display panel of the embodiments of the present application, the arrangement of the pixel circuits in each of the pixel circuit units is redesigned, and the M pixel circuits in each arrangement unit are arranged next to each other (i.e., clustered together). An orthographic projection of the at least one arrangement unit of each of the pixel circuit units on the substrate overlaps an orthographic projection of P sub-pixels of a corresponding one of the pixel units on the substrate, and P is an integer greater than or equal to 1 and less than N. Therefore, the pixel circuits are compactly arranged at a side of the P sub-pixels facing the substrate, the shielding area of the pixel circuits and the sub-pixels on a plane parallel to the substrate is reduced, which facilitates configuring a larger area that is not shielded by the pixel circuits and the sub-pixels as a light-transmitting area, so as to increase the overall light transmittance of the display panel, and thus the display panel can be light-transmitting and can be used to display, facilitating the integration of the photosensitive component under the screen. Moreover, the above arrangements of the pixel circuits can be applied in the entire display area of the display panel, so that the entire display area of the display panel can transmit light. On the one hand, the light-transmitting area of the display panel is increased, and on the other hand, the arrangement structures of the sub-pixels and the pixel circuits are more uniform in the entire display panel, the uneven display due to at least two sub-display areas with different light transmittances is avoided. The display panel according to the embodiments of the present application can achieve a full-screen display and a full-screen uniform display while the photosensitive component is integrated under the screen.

In some optional embodiments, a light-emitting area of a third color sub-pixel is less than a light-emitting area of a first color sub-pixel and less than a light-emitting area of a second color sub-pixel, and an orthographic projection of the arrangement unit on the substrate overlaps an orthographic projection of the first color sub-pixel and/or the second color sub-pixel on the substrate, that is, a plurality of pixel units are intended to overlap the larger sub-pixels, so as to increase the overlapping area between the plurality of pixel circuits and the sub-pixels. Moreover, more areas around the smaller third sub-pixel are left unshielded, the area of the light-transmitting area is increased, and thus the light-transmitting performance of the display panel is improved.

In some optional embodiments, at least some of adjacent arrangement units are connected with wires, and optionally, the wires are light-transmitting wires, so that the light-transmitting capability of the areas between the adjacent arrangement units is further improved. Optionally, the wire includes a first conductor layer and a second conductor layer that are stacked, a resistivity of the first conductor layer is less than a resistivity of the second conductor layer, a light transmittance of the second conductor layer is greater than a light transmittance of the first conductor layer, and an orthographic projection of the first conductor layer on the substrate is within an orthographic projection of the second conductor layer on the substrate, it is ensured that the wire between the adjacent arrangement units has a certain light transmittance and the load of the wire can be reduced, the display uniformity of the sub-pixels in various areas is improved.

In some optional embodiments, among a plurality of first signal lines, an extension direction of at least one second line segment is tilted with respect to a first direction, so that the diffraction of transmitted light by the display panel is reduced and the light sensing of the photosensitive component integrated with the display panel is improved.

BRIEF DESCRIPTION OF THE DRAWINGS

Other features, objects and advantages of the present application will become more apparent from reading the following detailed description of the non-limiting embodiments with reference to the accompanying drawings, in which the same or similar reference numerals represent the same or similar features, and the accompanying drawings are not drawn to actual scale.

DETAILED DESCRIPTION

Features and exemplary embodiments of various aspects of the present application will be described in detail below, and in order to make the purpose, technical solutions and advantages of the present application clearer, the present application is described in further detail below in combination with the accompanying drawings and specific embodiments. It should be understood that the specific embodiments described herein are used to explain the present application only, but not to limit the present application. For those skilled in the art, the present application can be implemented without some of these specific details. The following description of the embodiments is only to provide a better understanding of the present application by illustrating examples of the present application.

Figure 1:
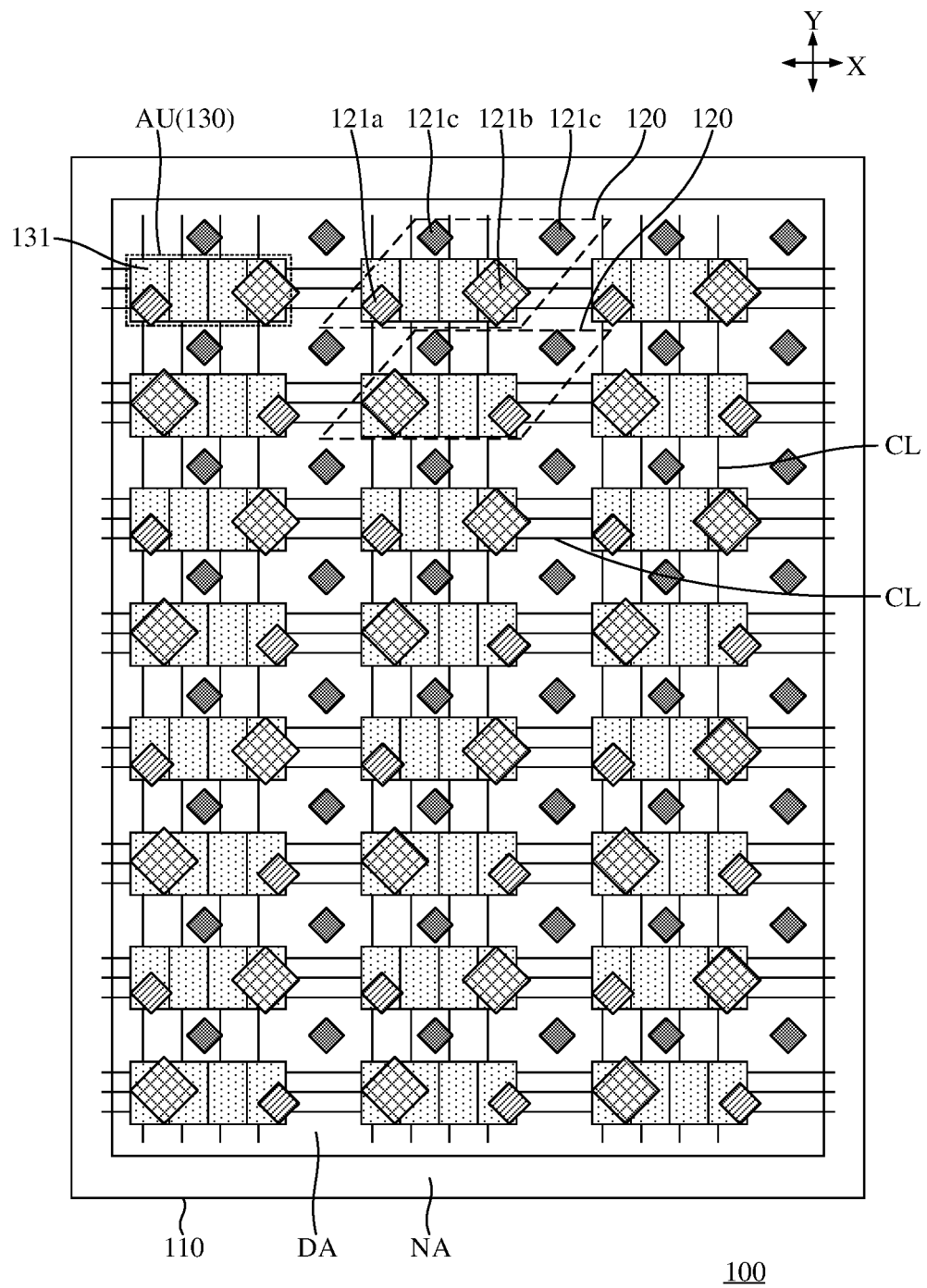
FIG. 1 shows a schematic top view of a display panel according to a first embodiment of the present application.

FIG. 1 shows a schematic top view of a display panel according to a first embodiment of the present application. The display panel 100 includes a substrate 110, a plurality of pixel units 120 and a plurality of pixel circuit units 130. The substrate 110 includes a display area DA and a non-display area NA surrounding at least a portion of the periphery of the display area DA.

The plurality of pixel units 120 are arranged on the substrate 110 in an array along a first direction X and a second direction Y intersecting each other, and particularly, the plurality of pixel units 120 are arranged in an array in the display area DA. Each of the pixel units 120 includes N sub-pixels 121, and N is an integer greater than or equal to 3. In the embodiment, for example, the pixel unit 120 includes four sub-pixels 121.

The plurality of pixel circuit units 130 are arranged on the substrate 110. Each of the pixel circuit units 130 includes N pixel circuits 131, and each of the pixel circuits 131 is electrically connected to a corresponding one of the sub-pixels 121. Each of the pixel circuit units 130 is provided with at least one arrangement unit AU, and in each arrangement unit AU, M pixel circuits 131 are arranged adjacently in sequence, M is an integer greater than or equal to 2 and less than or equal to N.

The pixel unit 120 is correspondingly electrically connected to the pixel circuit unit 130, an orthographic projection of all arrangement units AU of each of the pixel circuit units 130 on the substrate 110 overlaps an orthographic projection of P sub-pixels 121 of a corresponding one of the pixel units 120 on the substrate 110, and P is an integer greater than or equal to 1 and less than N. For example, in the embodiment, in the arrangement unit AU, the four pixel circuits 131 are arranged adjacently in sequence, the orthographic projection of all arrangement units AU of each of the pixel circuit units 130 on the substrate 110 overlaps the orthographic projection of two sub-pixels 121 of a corresponding pixel unit 120 on the substrate 110, and the other two sub-pixels 121 and their surrounding areas are not shielded by the pixel circuits 131.

According to the display panel 100 of the embodiments of the present application, the arrangement of the pixel circuits 131 in each of the pixel circuit units 130 is redesigned, and the M pixel circuits 131 in each arrangement unit AU are arranged next to each other (i.e., clustered together). An orthographic projection of the at least one arrangement unit AU of each of the pixel circuit units 130 on the substrate 110 overlaps an orthographic projection of P sub-pixels 121 of a corresponding one of the pixel units 120 on the substrate 110, and P is an integer greater than or equal to 1 and less than N. Therefore, the pixel circuits 131 are compactly arranged at a side of the P sub-pixels 121 facing the substrate 110, the shielding area of the pixel circuits 131 and the sub-pixels 121 on a plane parallel to the substrate 100 is reduced, which facilitates configuring a larger area that is not shielded by the pixel circuits 131 and the sub-pixels 121 as a light-transmitting area, so as to increase the overall light transmittance of the display panel 100, and thus the display panel 100 can be light-transmitting and can be used to display, facilitating the integration of the photosensitive component under the screen. Moreover, the above arrangements of the pixel circuits 131 can be applied in the entire display area of the display panel 100, so that the entire display area of the display panel 100 can transmit light. On the one hand, the light-transmitting area of the display panel 100 is increased, and on the other hand, the arrangement structures of the sub-pixels 121 and the pixel circuits 131 are more uniform in the entire display panel 100, the uneven display due to at least two sub-display areas with different light transmittances is avoided. The display panel 100 according to the embodiments of the present application can achieve a full-screen display and a full-screen uniform display while the photosensitive component is integrated under the screen.

In the embodiment, the orthographic projection of the arrangement units AU on the substrate 110 partially overlaps the orthographic projection of the sub-pixels 121 on the substrate 110, and in some optional embodiments, by reducing the size of the pixel circuit 131, the size of the arrangement unit AU can be reduced such that the orthographic projection of the P sub-pixels 121 on the substrate 110 completely covers the orthographic projection of all arrangement units AU of each of the pixel circuit units 130 on the substrate 110, the light transmittance of the display panel 100 is further improved.

Optionally, the sub-pixels 121 of each of the pixel units 120 include a first color sub-pixel 121a, a second color sub-pixel 121b and a third color sub-pixel 121c, a light-emitting area of the third color sub-pixel 121c is less than a light-emitting area of the first color sub-pixel 121a and less than a light-emitting area of the second color sub-pixel 121b, and an orthographic projection of the arrangement unit AU on the substrate 110 overlaps an orthographic projection of the first color sub-pixel 121a and/or the second color sub-pixel 121b on the substrate 110. A plurality of arrangement units AU are intended to overlap the larger sub-pixels 121, so as to increase the overlapping area between the plurality of pixel circuits 131 and the sub-pixels 121, and moreover, more areas around the smaller third sub-pixel 121 are left unshielded, the area of the light-transmitting area is increased, and thus the light-transmitting performance of the display panel 100 is improved.

Optionally, the first color sub-pixel 121a is a red sub-pixel, the second color sub-pixel 121b is a blue sub-pixel, and the third color sub-pixel 121c is a green sub-pixel. In the above embodiments, for example, each of the pixel units 120 includes one first color sub-pixel 121a, one second color sub-pixel 121b and two third color sub-pixels 121c. It will be understood, however, that the colors of the sub-pixels and the number of the sub-pixels of each color included in each of the pixel units 120 are not limited to the above examples, for example, each of the pixel units 120 may include one red sub-pixel, one blue sub-pixel and one green sub-pixel.

As shown in FIG. 1, at least some of adjacent arrangement units AU are connected with wires CL. Optionally, at least some of the wires CL are light-transmitting to improve the light-transmitting capability of the areas between the adjacent arrangement units AU. For example, in some embodiments, the wires CL are light-transmitting wires CL, and the material of the wires CL is, for example, Indium Tin Oxide (ITO), Indium Zinc Oxide (IZO), etc., which can further improve the light-transmitting capability of the areas between the adjacent arrangement units AU.

Figure 2:
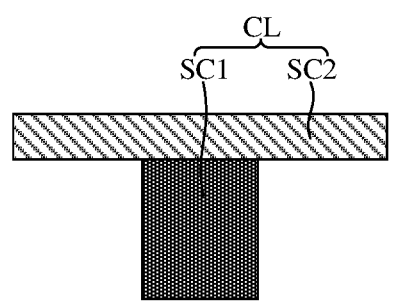
FIG. 2 shows a schematic cross-sectional view of a wire of a display panel according to an alternative embodiment of the present application.

FIG. 2 shows a schematic cross-sectional view of a wire of a display panel according to an alternative embodiment of the present application, in which the cross section is perpendicular to the extension direction of the wire CL. In an alternative embodiment, the wire CL includes a first conductor layer SC1 and a second conductor layer SC2 stacked in a direction perpendicular to the substrate 110. A resistivity of the first conductor layer SC1 is less than a resistivity of the second conductor layer SC2, and a light transmittance of the second conductor layer SC2 is greater than a light transmittance of the first conductor layer SC1. For example, the first conductor layer SC1 is a metal layer and the second conductor layer SC2 is a light-transmitting conductive layer such as ITO, IZO. An orthographic projection of the first conductor layer SC1 on the substrate 110 is within an orthographic projection of the second conductor layer SC2 on the substrate 110, it is ensured that the wire CL between the adjacent arrangement units AU has a certain light transmittance and the load of the wire CL can be reduced, the display uniformity of the sub-pixels 121 in various areas is improved.

Still referring to FIG. 1, in some embodiments, each of the pixel circuit units 130 is provided with one arrangement unit AU, and in the arrangement unit AU, the N pixel circuits 131 are arranged adjacently in sequence along the first direction X. For example, in the embodiment, four pixel circuits 131 are arranged adjacently in sequence along the first direction X.

The number of the arrangement units AU provided in each of the pixel circuit units 130, and the number and arrangement of the pixel circuits 131 in each of the arrangement units AU may not be limited to the above examples, and other cases are possible.

Figure 3:
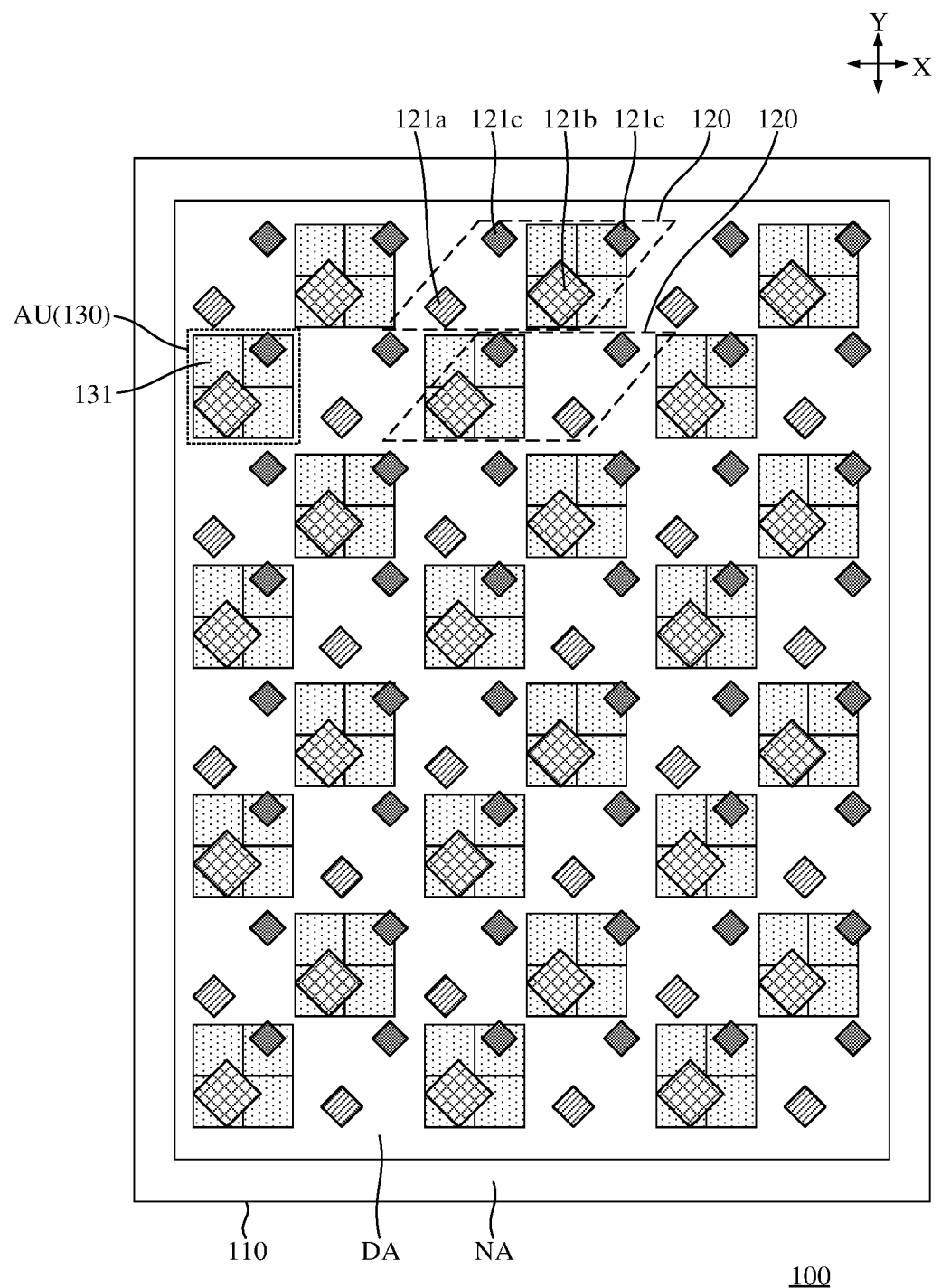
FIG. 3 shows a schematic top view of a display panel according to a second embodiment of the present application.

FIG. 3 shows a schematic top view of a display panel according to a second embodiment of the present application, in which a part of the structure of the second embodiment is the same as that of the first embodiment, which will not be repeated herein, and the differences will be described below.

In some embodiments, in at least one arrangement unit AU, the plurality of pixel circuits 131 are arranged in an array along the first direction X and the second direction Y.

For example, in the second embodiment, each of the pixel circuit units 130 is provided with one arrangement unit AU, and in the arrangement unit AU, the N pixel circuits 131 are arranged adjacently in an array along the first direction X and the second direction Y. For example, each of the pixel circuit units 130 includes four pixel circuits 131 which are arranged in a 2×2 layout in the arrangement unit AU. Therefore, in each of the arrangement units AU, the pixel circuits 131 may be arranged in sequence along a predetermined direction, or may be arranged in an array along two directions that intersect, or may be otherwise arranged adjacently in sequence.

Figure 4:
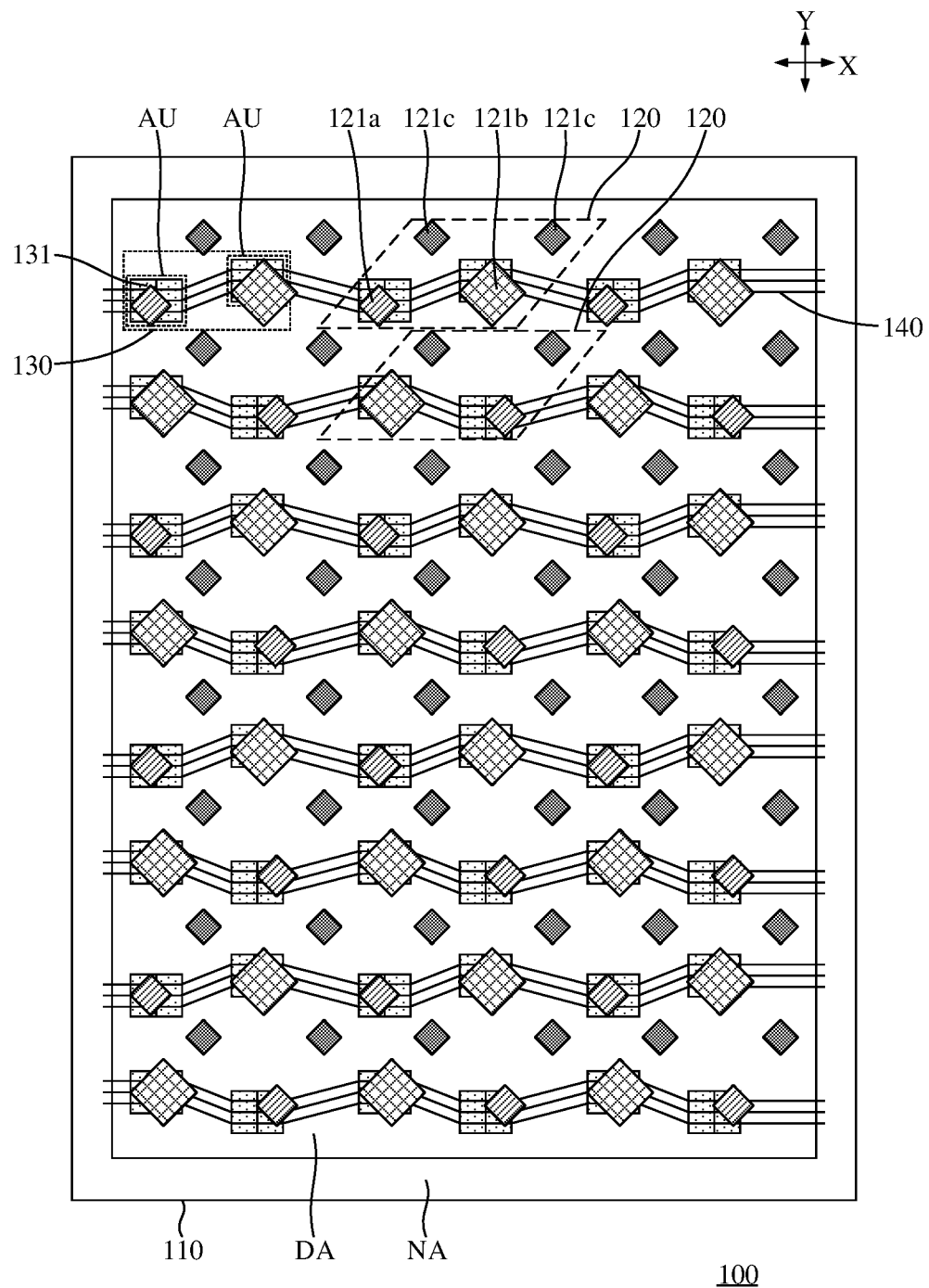
FIG. 4 shows a schematic top view of a display panel according to a third embodiment of the present application.
Figure 5:
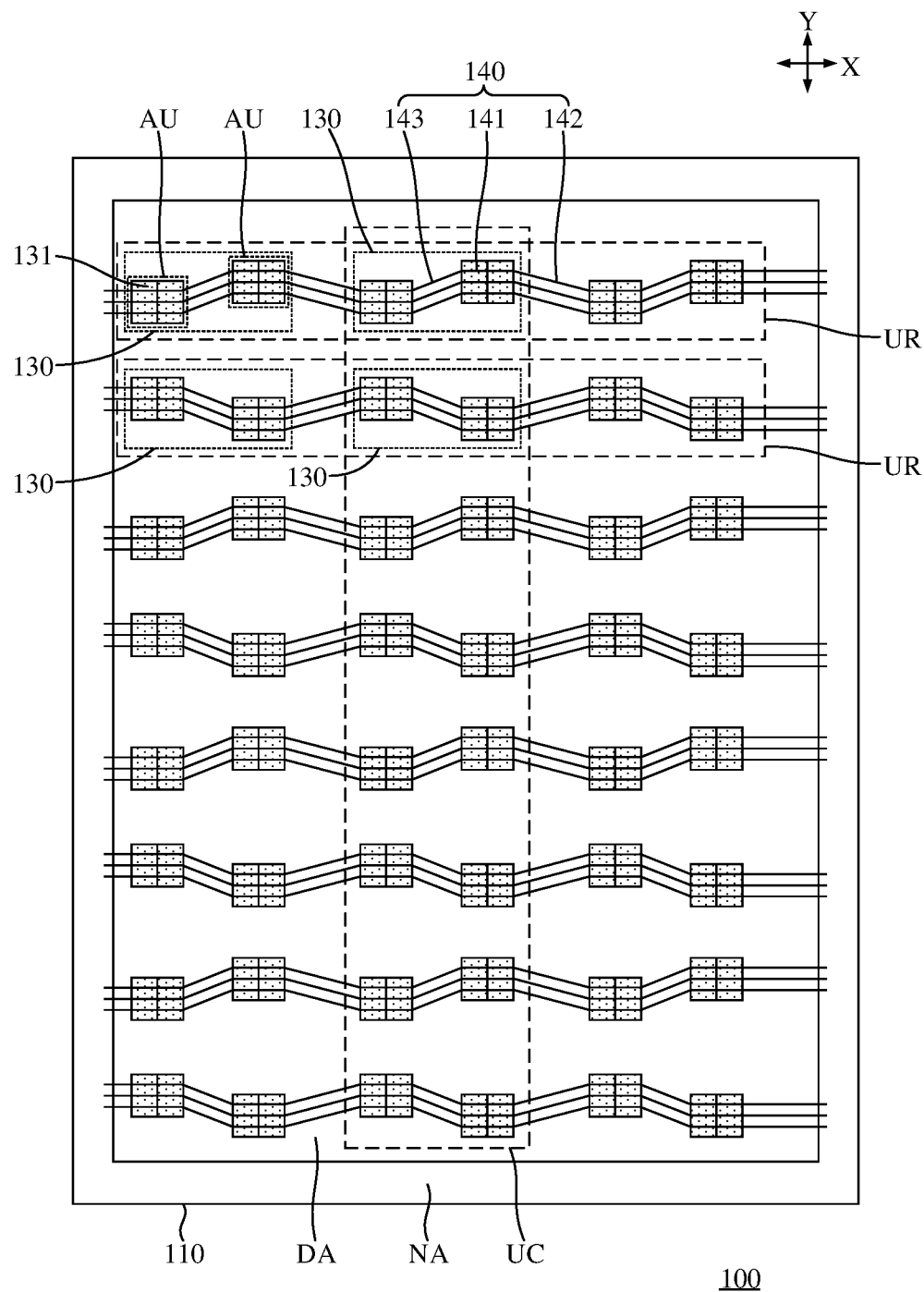
FIG. 5 shows a schematic top view of a display panel in which pixel units are omitted according to the third embodiment of the present application.

FIGS. 4 and 5 show a schematic top view of a display panel according to a third embodiment of the present application, in which the pixel units are omitted in FIG. 5. A part of the structure of the third embodiment is the same as that of the first embodiment, which will not be repeated herein, and the differences will be described below.

In the third embodiment, each of the pixel circuit units 130 is provided with at least two arrangement units AU. For example, each of the pixel units 120 includes one first color sub-pixel 121a, one second color sub-pixel 121b and two third color sub-pixels 121c. Each of the pixel circuit units 130 includes four pixel circuits 131. Herein, each of the pixel circuit units 130 is provided with two arrangement units AU, and in each of the arrangement units AU, two pixel circuits 131 are arranged adjacently along the first direction X. In the two arrangement units AU included in each of the pixel circuit units 130, an orthographic projection of one of the arrangement units AU on the substrate 110 overlaps the first color sub-pixel 121a, and an orthographic projection of the other of the arrangement units AU on the substrate 110 overlaps the second color sub-pixel 121b. It will be appreciated that when each of the pixel circuit units 130 includes at least two arrangement units AU, the number of arrangement units AU is not limited to the above examples, and may be three, four, etc. The number and arrangement of the pixel circuits 131 in each arrangement unit AU may also not be limited to the above examples.

Referring to FIG. 5, in some embodiments, the plurality of pixel circuit units 130 are arranged in a plurality of rows and columns. In each row of the pixel circuit units UR, a plurality of the pixel circuit units 130 are arranged along the first direction X, and in each column of the pixel circuit units UC, a plurality of the pixel circuit units 130 are arranged along the second direction Y.

Optionally, the display panel 100 further includes a plurality of first signal lines 140, each of the first signal lines 140 is connected to a row of the pixel circuit units UR. The first signal line 140 includes a first line segment 141 and a second line segment 142. An orthographic projection of the first line segment 141 on the substrate 110 is within an orthographic projection of the pixel circuit 131 on the substrate 110. The second line segment 142 is connected between adjacent pixel circuit units 130. An extension direction of at least one second line segment 142 is tilted with respect to the first direction X, so that the diffraction of transmitted light by the display panel 100 is reduced, and the light sensing of the photosensitive component integrated with the display panel 100 is improved.

Although each of the first signal lines 140 is connected to a row of the pixel circuit units UR, the number of the first signal lines 140 to which each row of the pixel circuit units UR is correspondingly connected is not limited to one, and may be two, three, and other numbers. The first signal line 140 includes, for example, at least one of a scan signal line and a light-emitting signal line, and the number of each type of signal line is not limited to one. In an example, each row of the pixel circuit units UR is correspondingly connected to three first signal lines 140, which include, for example, two scan signal lines and one light-emitting signal line.

Optionally, each of the pixel circuit units 130 is provided with at least two arrangement units AU, for example, in the embodiment, each of the pixel circuit units 130 is provided with two arrangement units AU. The first signal line 140 further includes a third line segment 143 which is connected between adjacent arrangement units AU in the pixel circuit unit 130. An extension direction of at least one third line segment 143 is tilted with respect to both of the first direction X and the second direction Y. Therefore, the diffraction of transmitted light by the display panel 100 is further reduced, and the light sensing of the photosensitive component integrated with the display panel 100 is improved.

Still referring to FIG. 5, in some embodiments, extension directions of the second line segments 142 of adjacent first signal lines 140 intersect each other to reduce the consistency of the extension of the first signal lines 140, so as to reduce the diffraction of transmitted light by the display panel 100. Optionally, extension directions of the third line segments 143 of adjacent first signal lines 140 intersect each other, so as to further increase the diversity of the extension directions of the first signal lines 140 and further reduce the diffraction of transmitted light by the display panel 100.

Figure 6:
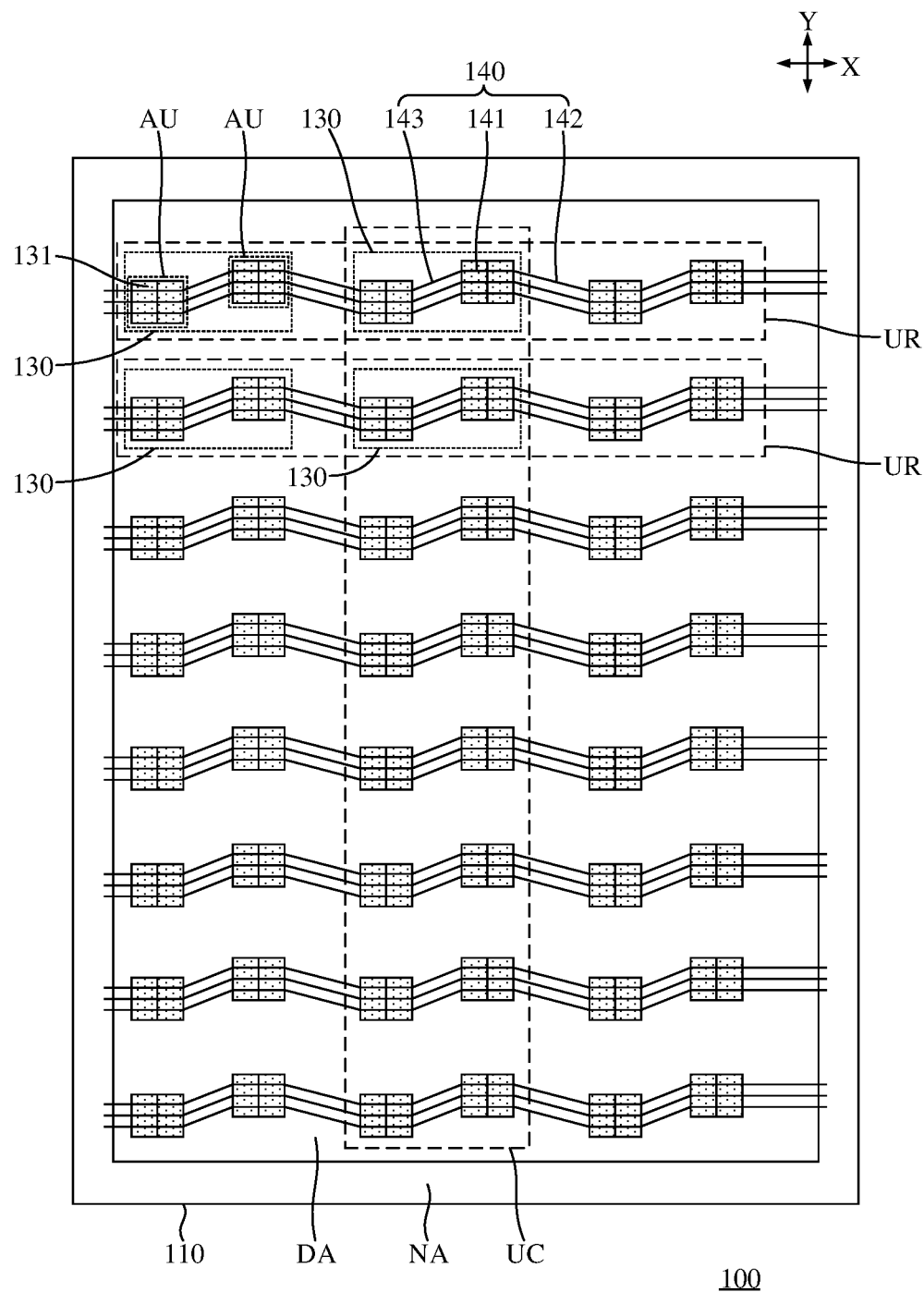
FIG. 6 shows a schematic top view of a display panel according to a fourth embodiment of the present application.

FIG. 6 shows a schematic top view of a display panel according to a fourth embodiment of the present application, in which the pixel units are omitted. A part of the structure of the fourth embodiment is the same as that of the third embodiment, which will not be repeated herein, and the differences will be described below.

In the fourth embodiment, the plurality of pixel circuit units 130 are arranged in a plurality of rows and columns. The display panel 100 includes a plurality of first signal lines 140, and each of the first signal lines 140 also includes a first line segment 141 and a second line segment 142. Optionally, extension directions of the second line segments 142 of adjacent first signal lines 140 are parallel to each other.

Moreover, in some embodiments, each of the pixel circuit units 130 is provided with at least two arrangement units AU, and the first signal line 140 further includes a third line segment 143 which is connected between adjacent arrangement units AU in the pixel circuit unit 130. Optionally, extension directions of the third line segments 143 of adjacent first signal lines 140 are parallel to each other.

Figure 7:
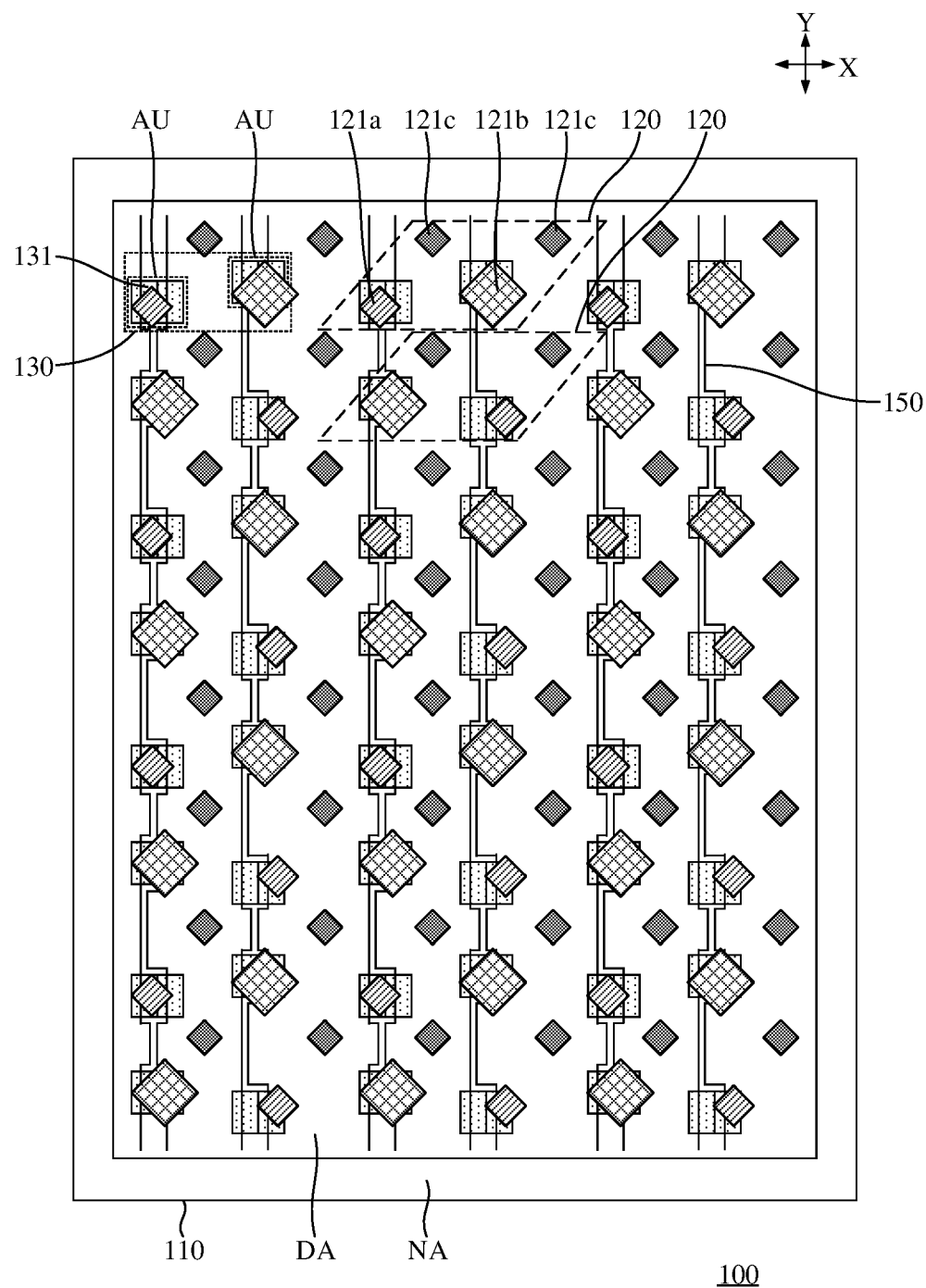
FIG. 7 shows a schematic top view of a display panel according to a fifth embodiment of the present application.
Figure 8:
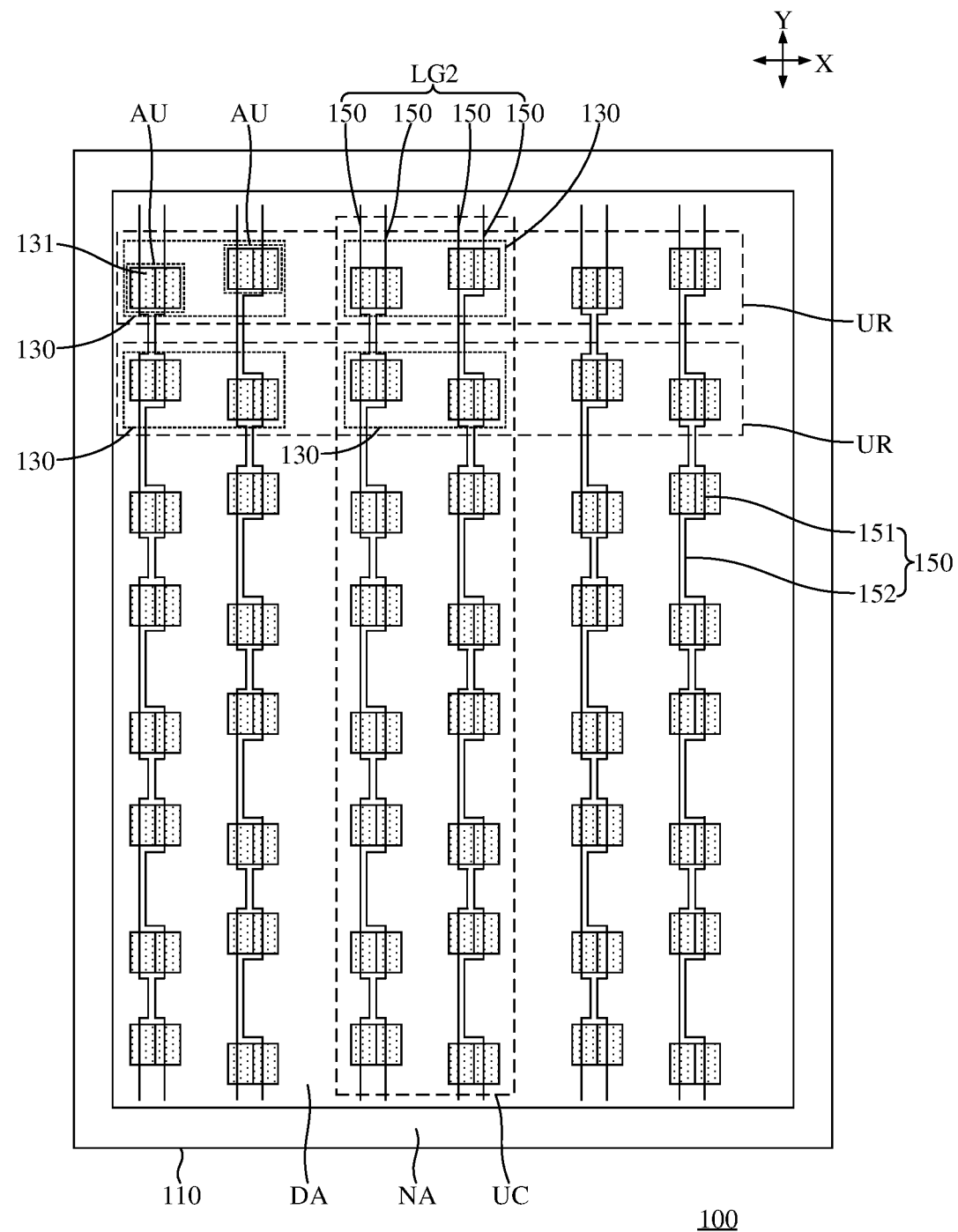
FIG. 8 shows a schematic top view of a display panel in which pixel units are omitted according to the fifth embodiment of the present application.

FIGS. 7 and 8 show a schematic top view of a display panel according to a fifth embodiment of the present application, in which the pixel units are omitted in FIG. 8. A part of the structure of the fifth embodiment is the same as that of the third embodiment, which will not be repeated herein, and the differences will be described below.

In the fifth embodiment, the plurality of pixel circuit units 130 are arranged in a plurality of rows and columns, in each row of the pixel circuit units UR, a plurality of the pixel circuit units 130 are arranged along the first direction X, and in each column of the pixel circuit units UC, a plurality of the pixel circuit units 130 are arranged along the second direction Y.

The display panel 100 may further include a plurality of second signal line groups LG2, each of the second signal line groups LG2 is connected with a column of the pixel circuit units UC. Each of the second signal line groups LG2 includes a plurality of second signal lines 150. Each of the second signal lines 150 includes a fourth line segment 151 and a fifth line segment 152. An orthographic projection of the fourth line segment 151 on the substrate 110 is within an orthographic projection of the pixel circuit 131 on the substrate 110, and the fifth line segment 152 is connected between adjacent pixel circuit units 130. Optionally, at least two of the second signal lines 150 are closer to each other at the fifth line segment 152 than at the fourth line segment 151, so that the signal lines between the adjacent pixel circuit units 130 are centralized to reduce the diffraction of transmitted light by the display panel 100.

The number of the second signal lines 150 included in the second signal line group LG2 may be adjusted and changed according to the design of the wiring structure of the display panel 100. The second signal line 150 includes, for example, at least one of a data signal line and a power supply signal line.

The embodiments of the present application further provide a display apparatus which may include the display panel 100 according to any one of the above embodiments. A display apparatus according to an embodiment will be described below as an example, in which the display apparatus includes the display panel 100 according to the above embodiments.

Figure 9:
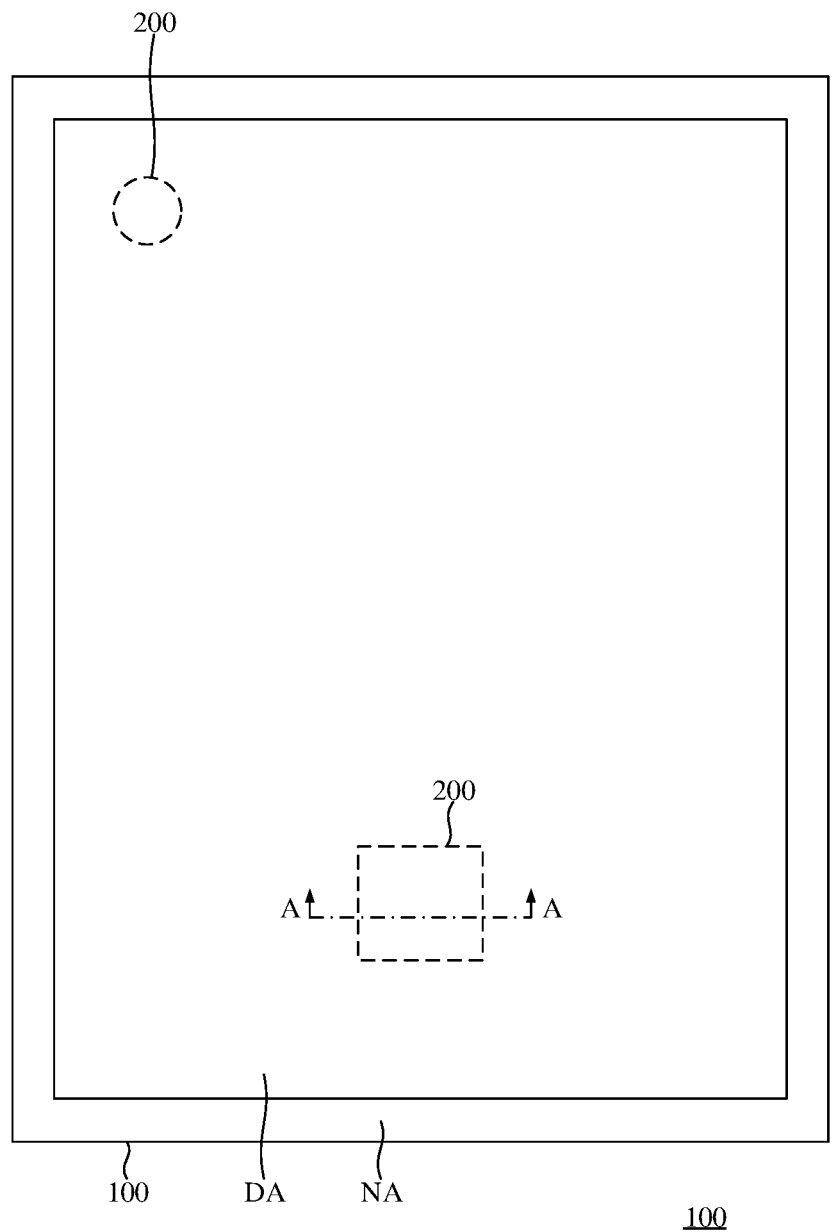
FIG. 9 shows a schematic top view of a display apparatus according to an embodiment of the present application.
Figure 10:
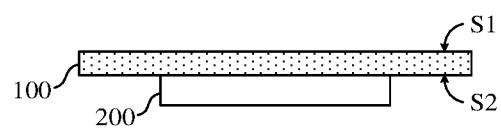
FIG. 10 shows a cross-sectional view at A-A in FIG. 9.

FIG. 9 shows a schematic top view of a display apparatus according to an embodiment of the present application, and FIG. 10 shows a cross-sectional view at A-A in FIG. 9. In the display apparatus of the embodiment, the display panel 100 may be the display panel 100 according to one of the above embodiments.

The display panel 100 includes a first surface S1 and a second surface S2 opposing to each other, in which the first surface S1 is a display surface. The display apparatus further includes at least one photosensitive component 200 located at a side corresponding to the second surface S2 of the display panel 100.

For example, there may be two photosensitive components 200, one of which may be an image capturing component for capturing external image information, and the other may be an optical fingerprint recognition component. In the embodiment, the image capturing component is a complementary metal oxide semiconductor (Complementary Metal Oxide Semiconductor, CMOS) image capturing component, and in some other embodiments, the image capturing component may be other image capturing components such as a charge-coupled device (Charge-coupled Device, CCD) image capturing component. It may be appreciated that the number and type of the photosensitive component 200 may not be limited to the above examples. For example, in some embodiments, the photosensitive component 200 may be a light sensor such as an infrared sensor, a proximity sensor, an infrared lens, a flood light sensing element, an ambient light sensor and a dot projector. In addition, other components such as a telephone receiver and a speaker may also be integrated at the side corresponding to the second surface S2 of the display panel 100 of the display apparatus.

The display panel 100 includes a substrate 110, a plurality of pixel units 120 and a plurality of pixel circuit units 130. The substrate 110 includes a display area DA and a non-display area NA surrounding at least a portion of the periphery of the display area DA. The plurality of pixel units 120 are arranged on the substrate 110 in an array along a first direction X and a second direction Y intersecting each other, each of the pixel units 120 includes N sub-pixels 121, and N is an integer greater than or equal to 3. The plurality of pixel circuit units 130 are arranged on the substrate 110. Each of the pixel circuit units 130 includes N pixel circuits 131, and each of the pixel circuits 131 is electrically connected to a corresponding one of the sub-pixels 121. Each of the pixel circuit units 130 is provided with at least one arrangement unit AU, and in the arrangement unit AU, M pixel circuits 131 are arranged adjacently in sequence, and M is an integer greater than or equal to 2 and less than or equal to N. The pixel unit 120 is correspondingly electrically connected to the pixel circuit unit 130, an orthographic projection of all arrangement units AU of each of the pixel circuit units 130 on the substrate 110 overlaps an orthographic projection of P sub-pixels 121 of a corresponding one of the pixel units 120 on the substrate 110, and P is an integer greater than or equal to 1 and less than N.

According to the display apparatus of the embodiments of the present application, the arrangement of the pixel circuits 131 in each of the pixel circuit units 130 of the display panel 100 is redesigned, and the M pixel circuits 131 in each arrangement unit AU are arranged next to each other (i.e., clustered together). An orthographic projection of the at least one arrangement unit AU of each of the pixel circuit units 130 on the substrate 110 overlaps an orthographic projection of P sub-pixels 121 of a corresponding one of the pixel units 120 on the substrate 110, and P is an integer greater than or equal to 1 and less than N. Therefore, the pixel circuits 131 are compactly arranged at a side of the P sub-pixels 121 facing the substrate 110, the shielding area of the pixel circuits 131 and the sub-pixels 121 on a plane parallel to the substrate 100 is reduced, which facilitates configuring a larger area that is not shielded by the pixel circuits 131 and the sub-pixels 121 as a light-transmitting area, so as to increase the overall light transmittance of the display panel 100, and thus the display panel 100 can be light-transmitting and can be used to display, facilitating the integration of the photosensitive component 200 under the screen.

In the embodiment, the above arrangements of the pixel circuits 131 can be applied in the entire display area DA of the display panel 100, so that the entire display area DA of the display panel 100 can transmit light. On the one hand, the light-transmitting area of the display panel 100 is increased, and on the other hand, the arrangement structures of the sub-pixels 121 and the pixel circuits 131 are more uniform in the entire display panel 100, the uneven display due to at least two sub-display areas with different light transmittances is avoided. The display panel 100 according to the embodiments of the present application can achieve a full-screen display and a full-screen uniform display while the photosensitive component 200 is integrated under the screen.

The above embodiments of the present application do not exhaustively describe all the details, nor do they limit the present application to the specific embodiments as described. Obviously, according to the above description, many modifications and changes can be made. These embodiments are selected and specifically described in the specification to better explain the principles and practical applications of the present application, so that those skilled in the art can make good use of the present application and make modifications based on the present application. The present application is limited only by the claims and the full scope and equivalents thereof

What is claimed is:

1. A display panel, comprising:
a substrate;
a plurality of pixel units arranged on the substrate in an array along a first direction and a second direction intersecting each other, each pixel unit of the plurality of pixel units comprising N sub-pixels, N being an integer greater than or equal to 3, wherein the N sub-pixels of each pixel unit of the plurality of pixel units further comprise:
a first color sub-pixel;
a second color sub-pixel; and
a third color sub-pixel, a light-emitting area of the third color sub-pixel is less than a light-emitting area of the first color sub-pixel and less than a light-emitting area of the second color sub-pixel; and
a plurality of pixel circuit units arranged on the substrate, each pixel circuit unit of the plurality of pixel circuit units comprises:
N pixel circuits, each pixel circuit of the N pixel circuits being electrically connected to a corresponding one of the N sub-pixels, each pixel circuit unit of the plurality of pixel circuit units being provided with a first arrangement unit and a second arrangement unit, an orthographic projection of the first arrangement unit on the substrate overlaps the first color sub-pixel, and an orthographic projection of the second arrangement unit on the substrate overlaps the second color sub-pixel, and, in each arrangement unit, M pixel circuits being arranged adjacently in sequence, M being an integer greater than or equal to 2 and less than or equal to N, wherein an orthographic projection of all arrangement units of each pixel circuit unit of the plurality of pixel circuit units on the substrate overlaps an orthographic projection of P sub-pixels of a corresponding pixel unit of the plurality of pixel units on the substrate, and P is an integer greater than or equal to 1 and less than N.

2. The display panel of claim 1, wherein an orthographic projection of all arrangement units on the substrate overlaps an orthographic projection of the first color sub-pixel and the second color sub-pixel on the substrate.

3. The display panel of claim 1, wherein at least two arrangement units are adjacent, the adjacent arrangement units are connected with wires, and the wires are light-transmitting wires.

4. The display panel of claim 1, wherein at least two arrangement units are adjacent, the adjacent arrangement units are connected with wires, each of the wires comprises a first conductor layer and a second conductor layer stacked in a direction perpendicular to the substrate, a resistivity of the first conductor layer is less than a resistivity of the second conductor layer, a light transmittance of the second conductor layer is greater than a light transmittance of the first conductor layer, and an orthographic projection of the first conductor layer on the substrate is within an orthographic projection of the second conductor layer on the substrate.

5. The display panel of claim 1, wherein, in at least two arrangement units, the N pixel circuits is arranged in an array along the first direction and the second direction.

6. The display panel of claim 1, wherein the plurality of pixel circuit units is arranged in a plurality of rows and columns,
in each row of the plurality of pixel circuit units, the plurality of pixel circuit units is arranged along the first direction, and, in each column of the plurality of pixel circuit units, the plurality of pixel circuit units is arranged along the second direction, and the display panel further comprises:

a plurality of first signal lines, each first signal line of the plurality of first signal lines being connected to a row of the plurality of pixel circuit units, each first signal line comprising:

a first line segment and a second line segment, an orthographic projection of the first line segment on the substrate being within an orthographic projection of the pixel circuit on the substrate, the second line segment being connected between adjacent pixel circuit units, and an extension direction of at least one second line segment being tilted with respect to the first direction.

7. The display panel of claim 6, wherein each first signal line of the plurality of first signal lines further comprises:
a third line segment being connected between adjacent arrangement units in each pixel circuit unit, and an extension direction of at least one third line segment is tilted with respect to both of the first direction and the second direction.

8. The display panel of claim 6, wherein extension directions of second line segments of adjacent first signal lines intersect.

9. The display panel of claim 7, wherein extension directions of third line segments of adjacent first signal lines intersect.

10. The display panel of claim 1, wherein the plurality of pixel circuit units is arranged in a plurality of rows and columns,
in each row of the plurality of pixel circuit units, the plurality of the pixel circuit units is arranged along the first direction,
in each column of the plurality of pixel circuit units, the plurality of the pixel circuit units is arranged along the second direction, the display panel further comprises:
a plurality of second signal line groups, each second signal line group of the plurality of second signal line groups is connected with a column of the pixel circuit units and further comprises:

a plurality of second signal lines, each second signal line of the plurality of second signal lines further comprising:

a fourth line segment and a fifth line segment, an orthographic projection of the fourth line segment on the substrate being within an orthographic projection of each pixel circuit on the substrate, the fifth line segment being connected between adjacent pixel circuit units, and at least two of the second signal lines being closer to each other at the fifth line segment than at the fourth line segment.

11. The display panel of claim 1, wherein the orthographic projection of the P sub-pixels on the substrate completely covers the orthographic projection of at least one arrangement unit of each pixel circuit unit of the plurality of pixel circuit units on the substrate.

12. The display panel of claim 6, wherein each first signal line of the plurality of first signal lines further comprises:
at least one of a scan signal line and a light-emitting signal line.

13. The display panel of claim 10, wherein each second signal line of the plurality of second signal lines further comprises:
at least one of a data signal line and a power supply signal line.

14. The display panel of claim 6, wherein extension directions of second line segments of adjacent first signal lines are parallel to each other.

15. The display panel of claim 7, wherein extension directions of third line segments of adjacent first signal lines are parallel to each other.

16. The display panel of claim 1, wherein each pixel circuit unit of the plurality of pixel circuit units includes four pixel circuits arranged adjacently in sequence.

17. The display panel of claim 1, wherein each pixel circuit unit of the plurality of pixel circuit units includes four pixel circuits which are arranged in a 2×2 layout.

18. The display panel of claim 1, further comprising:
two photosensitive components configured to capture external image information and perform optical fingerprint recognition.

* * * * *